United States Patent
Bae et al.

(10) Patent No.: US 12,183,414 B2
(45) Date of Patent: Dec. 31, 2024

(54) MEMORY DEVICE AND METHOD OF TESTING THE MEMORY DEVICE FOR FAILURE

(71) Applicant: SK hynix Inc., Icheon-si (KR)

(72) Inventors: Byung Wook Bae, Icheon-si (KR); Jung Ryul Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/126,267

(22) Filed: Mar. 24, 2023

(65) Prior Publication Data
US 2024/0120020 A1 Apr. 11, 2024

(30) Foreign Application Priority Data
Oct. 11, 2022 (KR) .................. 10-2022-0129289

(51) Int. Cl.
*G11C 29/54* (2006.01)
(52) U.S. Cl.
CPC .................................. *G11C 29/54* (2013.01)
(58) Field of Classification Search
CPC .............................. G11C 29/54; G11C 29/025
USPC ........................................................ 714/720
See application file for complete search history.

(56) References Cited

U.S. PATENT DOCUMENTS

| | | | |
|---|---|---|---|
| 2006/0022324 A1* | 2/2006 | Yu | H01L 25/03 257/E25.023 |
| 2013/0032950 A1* | 2/2013 | Ware | H01L 25/0657 257/774 |
| 2014/0013070 A1* | 1/2014 | Toronyi | G06F 13/1668 711/167 |
| 2015/0037914 A1* | 2/2015 | Takahashi | H01L 22/14 438/15 |
| 2018/0233206 A1* | 8/2018 | Yu | G11C 16/10 |
| 2019/0057756 A1* | 2/2019 | Kim | H10B 41/27 |

FOREIGN PATENT DOCUMENTS

KR 101060699 B1 8/2011
KR 1020190142715 A 12/2019

* cited by examiner

*Primary Examiner* — James C Kerveros
(74) *Attorney, Agent, or Firm* — WILLIAM PARK & ASSOCIATES LTD.

(57) ABSTRACT

A memory device, and a method of testing the memory device for failure, includes a first chip including a memory cell array and a second chip overlapping with the first chip. The second chip includes: a semiconductor substrate including a peripheral circuit area and a lower test area; a plurality of sub-test pads and an input pad, disposed on the lower test area of the semiconductor substrate and spaced apart from each other; a plurality of sub-test circuits respectively connected to the plurality of sub-test pads; and a detection circuit connected to a plurality of terminals of the plurality of sub-test circuits, the detection circuit configured to output a detection signal changed according to a plurality of signals input from the plurality of terminals.

17 Claims, 8 Drawing Sheets

FIG. 3

| No. | Input(TS) | 1 CD | 2 CD | 3 CD | 4 CD | Output(DS) |
|---|---|---|---|---|---|---|
| 1 | H | H | L | L | L | FIRST SIGNAL |
| 2 | H | H | H | L | L | SECOND SIGNAL |
| 3 | H | L | L | H | L | THIRD SIGNAL |
| 4 | H | L | L | H | H | FOURTH SIGNAL |
| 5 | H | L | L | L | L | Error 1 |
| 6 | H | H | L/H | L/H | H | Error 2 |
| 7 | H | L/H | H | H | L/H | Error 3 |

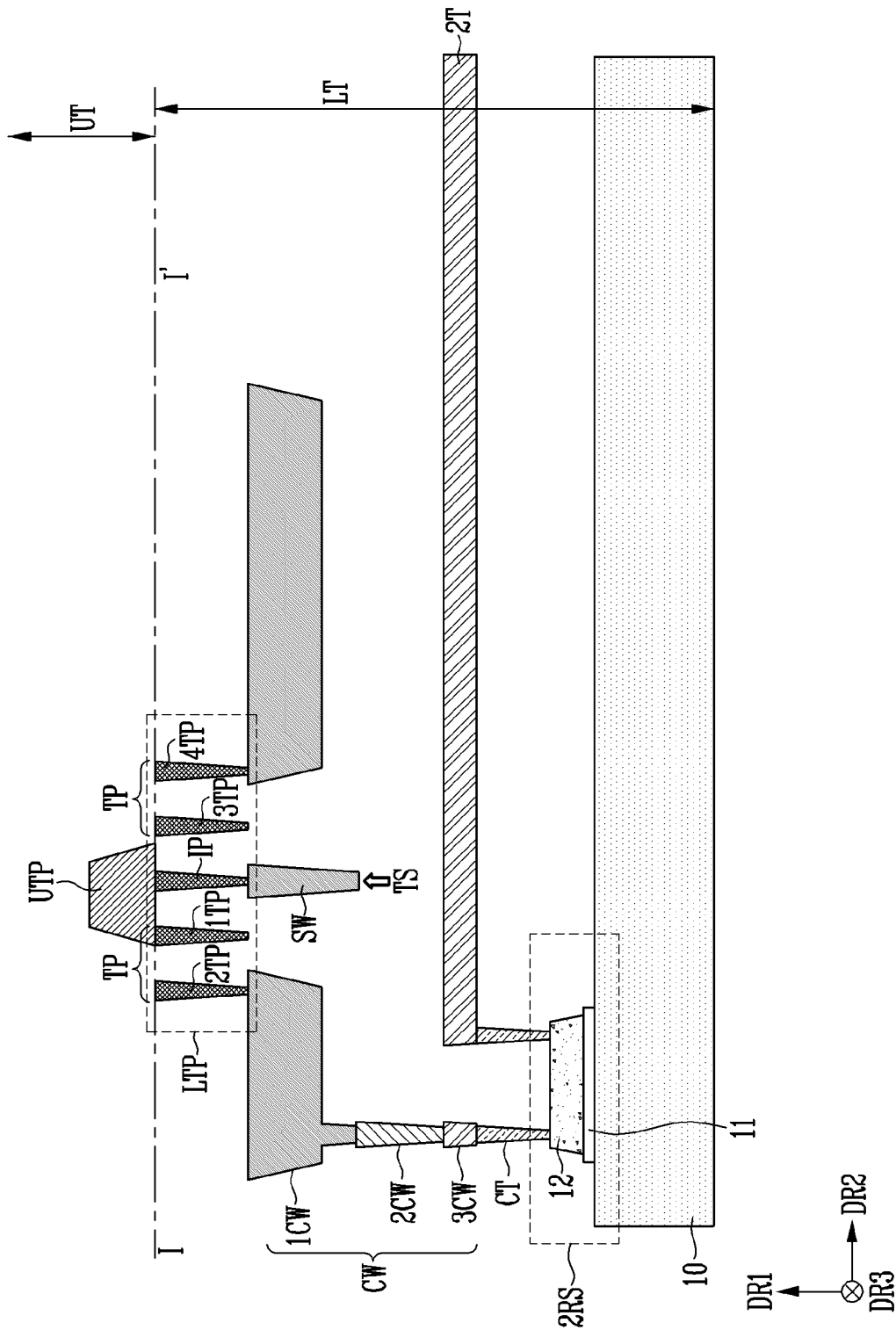

MEMORY DEVICE AND METHOD OF TESTING THE MEMORY DEVICE FOR FAILURE

CROSS-REFERENCE TO RELATED APPLICATION

The present application claims priority under 35 U.S.C. § 119(a) to Korean patent application number 10-2022-0129289, filed on Oct. 11, 2022, in the Korean Intellectual Property Office, the entire disclosure of which is incorporated herein by reference.

BACKGROUND

1. Technical Field

The present disclosure generally relates to a memory device and a method of testing the same for a failure, and more particularly, to a three-dimensional memory device and a method of testing the same for a failure.

2. Related Art

A memory device may be classified as a volatile memory device, from which stored data is lost when the supply of power is interrupted, or a nonvolatile memory device, in which stored data is retained even when the supply of power is interrupted.

A nonvolatile memory device may include NAND flash memory, NOR flash memory, resistive random-access memory (ReRAM), phase-change random-access memory (PRAM), magnetoresistive random-access memory (MRAM), ferroelectric random-access memory (FRAM), spin transfer torque random-access memory (STT-RAM), and the like.

A NAND flash memory system may include a memory device configured to store data and a controller configured to control the memory device. The memory device may include a memory cell array in which data is stored and peripheral circuits configured to perform a program, read, or erase operation in response to a command transmitted from the controller.

The memory cell array may include a plurality of memory blocks, and each of the plurality of memory blocks may include a plurality of memory cells.

As the degree of integration of memory devices increases, failures due to various causes generally increase.

SUMMARY

Some embodiments may provide a memory device and a method of testing a memory device for a failure, which can check a bonding overlay failure.

In accordance with an embodiment of the present disclosure, a memory device includes a first chip including a memory cell array and a second chip overlapping with the first chip. The second chip includes: a semiconductor substrate including a peripheral circuit area and a lower test area; a plurality of sub-test pads and an input pad, disposed on the lower test area of the semiconductor substrate and spaced apart from each other; a plurality of sub-test circuits respectively connected to the plurality of sub-test pads; and a detection circuit connected to a plurality of terminals of the plurality of sub-test circuits, the detection circuit configured to output a detection signal changed according to a plurality of signals input from the plurality of terminals.

Also in accordance with the present disclosure is a method of testing a memory device for a failure The method includes: providing a first chip including an upper test pad; providing a second chip including an input pad, a plurality of sub-test pads arranged at both sides of the input pad to be spaced apart from each other, a plurality of sub-test circuits connected to the sub-test pads, and a detection circuit connected to the plurality of sub-test circuits; bonding the first chip and the second chip to each other such that the upper test pad and the input pad are connected to each other; outputting a plurality of signals input to the detection circuit from the plurality of sub-test circuits by inputting a test signal to the input pad; and determining an alignment error between the first chip and the second chip, based on a detection signal output from the detection circuit according to the plurality of signals.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a table illustrating signals output from sub-test circuits and a detection signal output from a detection circuit in accordance with an embodiment of the present disclosure.

FIGS. 4A and 4B are sectional views illustrating a structure of a memory device in accordance with an embodiment of the present disclosure.

DETAILED DESCRIPTION

The specific structural or functional descriptions disclosed herein are merely illustrative for the purpose of describing embodiments according to the concept of the present disclosure. Embodiments according to the concept of the present disclosure can be implemented in various forms and should not be construed as being limited to the embodiments set forth herein.

Figure 1:
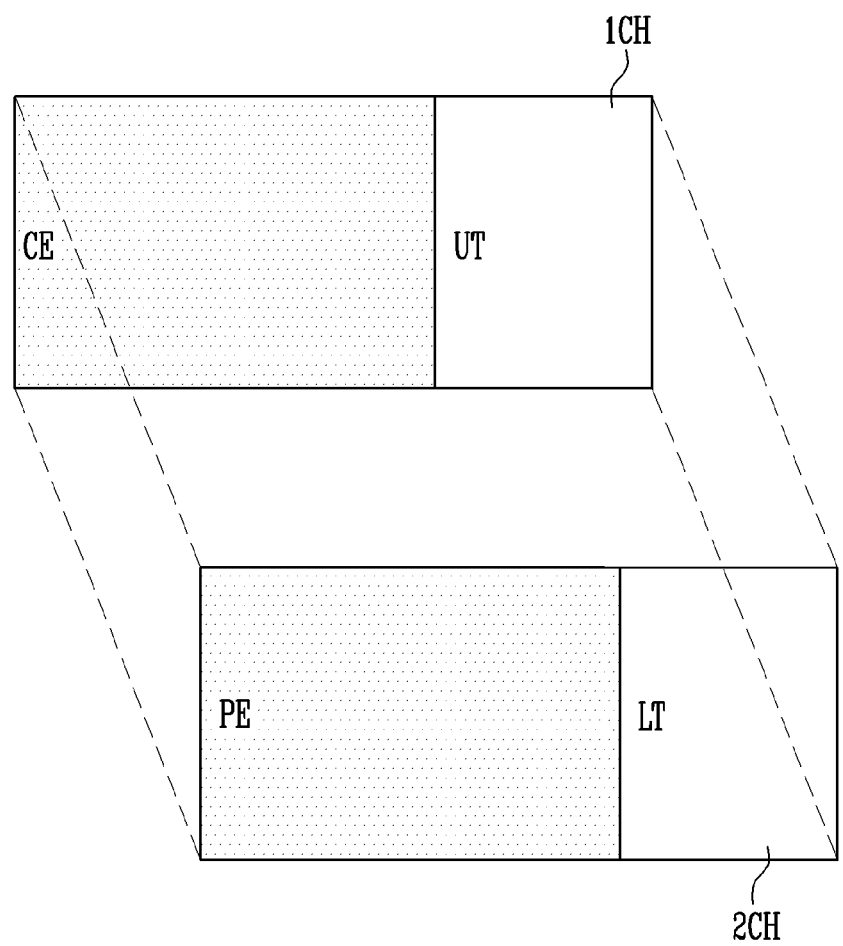
FIG. 1 is a diagram illustrating a first chip and a second chip.

FIG. 1 is a diagram illustrating a first chip and a second chip.

Referring to FIG. 1, a memory device in accordance with an embodiment of the present disclosure may include a first chip 1CH and a second chip 2CH. The first chip 1CH may include a memory cell array area CE including a memory cell array and an upper test area UT including an upper test pad (see UTP shown in FIGS. 4A and 4B), and the upper test area UT may be configured to be connected to the memory cell array area CE.

The second chip 2CH may overlap with the first chip 1CH. The first chip 1CH and the second chip 2CH may be coupled to each other through a wafer bonding process. The second chip 2CH may include a peripheral circuit area PE and a lower test area LT. A peripheral circuit disposed in the second chip 2CH may control the operation of the memory cell array disposed in the first chip 1CH. The lower test area LT may be connected to the peripheral circuit area PE and include a lower test pad (see LTP shown in FIGS. 4A and 4B), a sub-test circuit, and a detection circuit.

The memory cell array disposed in the memory cell array area CE may include a plurality of memory cells in which data is stored. In an embodiment, the memory cell array may include a three-dimensional memory cell array. The plurality of memory cells may store single-bit data or multi-bit data of two or more bits according to a program method. The plurality of memory cells may constitute a plurality of strings. Memory cells included in each of the strings may be electrically connected to each other through a channel. Channels included in the strings may be connected to a page buffer (not shown) of the peripheral circuit through bit lines.

The peripheral circuit disposed in the peripheral circuit area PE may be configured to perform a program operation for storing data in the memory cells and a verify operation, to perform a read operation for outputting data stored in the memory cells, or to perform an erase operation for erasing data stored in the memory cells. The peripheral circuit disposed in the peripheral circuit area PE may include a voltage generating circuit, a row decoder, a source line driver (not shown), a control circuit, a page buffer, a column decoder, and an input-output circuit.

In an embodiment of the present disclosure, an alignment error and a bonding error between the first chip 1CH and the second chip 2CH are detected in a process of bonding the first chip 1CH and the second chip 2CH to each other, so that a failure of the memory device can be reduced. Hereinafter, an upper test pad and a lower test pad, which are used to detect an alignment error and a bonding error between the first chip 1CH and the second chip 2CH, and an error detection method using the upper test pad and the lower test pad will be described.

Figure 2:
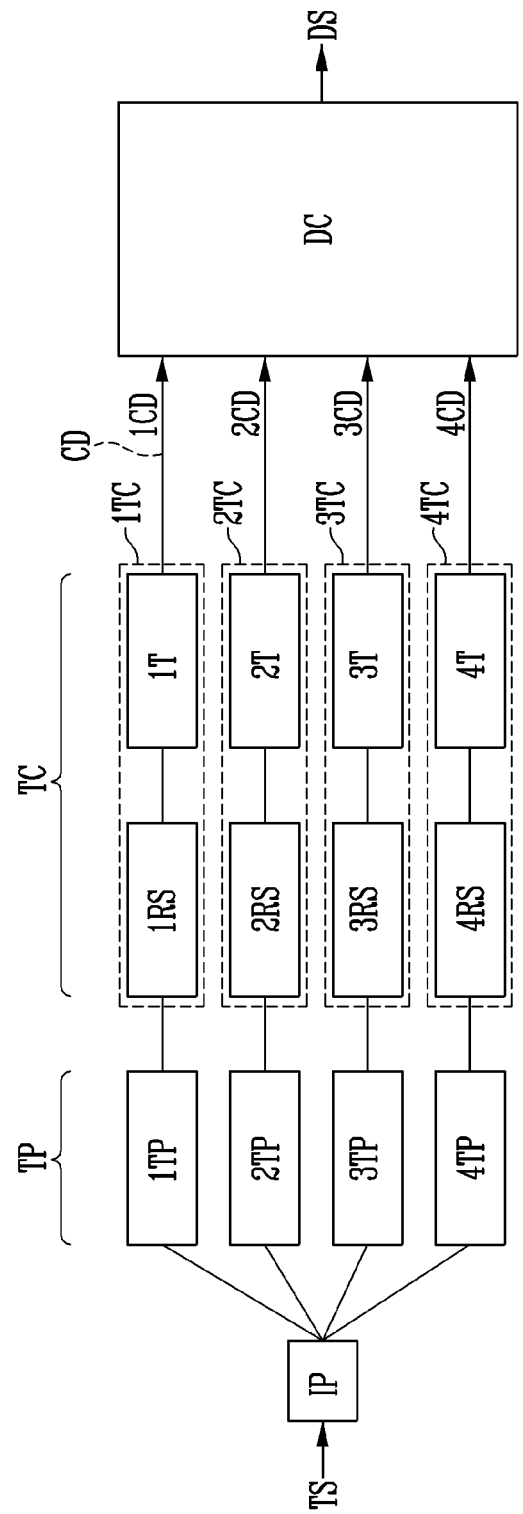
FIG. 2 is a diagram illustrating a lower test area of the second chip shown in FIG. 1.

FIG. 2 is a diagram illustrating the lower test area of the second chip shown in FIG. 1.

FIG. 2 is a diagram illustrating in detail a connection relationship between a plurality of sub-test pads TP and a plurality of sub-test circuits TC, which are included in the second chip shown in FIG. 1, and a detection circuit DC.

Referring to FIG. 2, the plurality of sub-test circuits TC may respectively correspond to the plurality of sub-test pads TP. In an embodiment, the plurality of sub-test pads TP may include first to fourth sub-test pads 1TP to 4TP, and the plurality of sub-test circuits TC may include first to fourth sub-test circuits 1TC to 4TC. Each sub-test circuit TC may include a resistor connected to a sub-test pad corresponding thereto and a terminal connected to the detection circuit DC. In an embodiment, the first to fourth sub-test circuits 1TC to 4TC may respectively include first to fourth resistors 1RS to 4RS, and respectively include first to fourth terminals 1T to 4T. The first to fourth resistors 1RS to 4RS may be connected to the detection circuit DC through the first to fourth terminals 1T to 4T.

More specifically, the first to fourth sub-test pads 1TP to 4TP may be respectively connected to the first to fourth resistors 1RS to 4RS. For example, the first sub-test pad 1TP may be connected to the first resistor 1RS, and the second sub-test pad 2TP may be connected to the second resistor 2RS. The first to fourth resistors 1RS to 4RS may be respectively connected to the first to fourth terminals 1T to 4T. For example, the first resistor 1RS may be connected to the first terminal 1T, and the second resistor 2RS may be connected to the second terminal 2T. Each of the first to fourth terminals 1T to 4T may be connected to the detection circuit DC.

When a test signal TS is input to the first to fourth sub-test pads 1TP to 4TP, first to fourth sub-test code signals 1CD to 4CD may be output to the first to fourth terminals 1T to 4T via the first to fourth resistors 1RS to 4RS. The first to fourth sub-test code signals 1CD to 4CD may be input to the detection circuit DC through first to fourth terminals 1T to 4T. The detection circuit DC may be configured to output a detection signal DS changed according to the first to fourth sub-test code signals 1CD to 4CD. To this end, the detection circuit DC may include a pulse counter, a multiplexer, and the like. The test signal TS and the first to fourth sub-test code signals 1CD to 4CD may correspond to a current, a voltage, or the like. In an embodiment, the test signal TS and the first to fourth sub-test code signals 1CD to 4CD may correspond to a first logic level or a second logic level. The first logic level may correspond to a low (L) signal, and the second logic level may correspond to a high (H) signal.

The first to fourth resistors 1RS to 4RS and the first to fourth terminals 1T to 4T may constitute the first to fourth sub-test circuits 1TC to 4TC, respectively. For example, the first resistor 1RS and the first terminal 1T may constitute the first sub-test circuit 1TC. The first to fourth resistors 1RS to 4RS may have different resistance values. Because the first to fourth resistors 1RS to 4RS have different resistance values, a corresponding relationship of signals output from the first to fourth sub-test circuits 1TC to 4TC and the first to fourth sub-test pads 1TP to 4TP can be determined.

Whether a connection between each of the first to fourth sub-test pads 1TP to 4TP and an input pad IP has been made may be determined according to an alignment between the first chip 1CH and the second chip 2CH, which are shown in FIG. 1. Logic levels corresponding to the first to fourth sub-test code signals 1CD to 4CD may be changed according to whether a connection between each of the first to fourth sub-test pads 1TP to 4TP and an input pad IP has been made.

FIG. 3 is a diagram illustrating signals output from the sub-test circuits and a detection signal output from the detection circuit in accordance with an embodiment of the present disclosure.

Referring to FIGS. 2 and 3, a test signal TS (Input) input to the input pad IP may be output as first to fourth sub-test code signals 1CD to 4CD having various logic levels through the first to fourth sub-test circuits 1TC to 4TC according to an alignment between the first chip 1CH and the second chip 2CH, which are shown in FIG. 1. Logic levels output as the first to fourth sub-test code signals 1CD to 4CD may be output as a detection signal DS (Output) through a logical operation performed by the detection circuit DC.

Referring to FIG. 3, the test signal TS and the first to fourth sub-test code signals 1CD to 4CD may include a first logic level and a second logic level. For example, the first logic level may correspond to a low (L) signal, and the second logic level may correspond to a high (H) signal.

The second logic level H may be input as the test signal TS to the input pad IP. When the second logic level H is input as the test signal TS, the first logic level L or the second logic level H may be output as each of the first to fourth sub-test code signals 1CD to 4CD via each of the first to fourth sub-test circuits 1TC to 4TC. Whether the first logic level L or the second logic level H is to be output from each of the first to fourth sub-test circuits 1TC to 4TC is determined according to whether an electrical connection between the input pad IP and each of the first to fourth sub-test pads 1TP to 4TP has been made. Because the first to fourth sub-test pads 1TP to 4TP are electrically connected to the first to fourth sub-test circuits 1TC to 4TC, respectively, whether the first logic level L or the second logic level H is to be output from each of the first to fourth sub-test circuits 1TC to 4TC is determined according to whether an electrical connection between the input pad IP and each of the first to fourth sub-test circuits 1TC to 4TC has been made.

In an embodiment, the first logic level L is output from a sub-test circuit which is not electrically connected to the input pad IP among the plurality of sub-test circuits 1TC to 4TC, and the second logic level H is output from a sub-test circuit electrically connected to the input pad IP among the plurality of sub-test circuits 1TC to 4TC. For example, when the input pad IP and the first sub-test pad 1TP are electrically connected to each other, so that the input pad IP and the first sub-test circuit 1TC are electrically connected to each other, the first sub-test circuit 1TC may output the second logic level H as the first sub-test code signal 1CD. For example, when the input pad IP and the first sub-test pad 1TP are not electrically connected to each other, so that the input pad IP and the first sub-test circuit 1TC are not electrically connected to each other, the first sub-test circuit 1TC may output the first logic level L as the first sub-test code signal 1CD.

When the first to fourth sub-test code signals 1CD to 4CD are input to the detection circuit DC, a detection signal DS may be output through a logical operation performed by the detection circuit DC. The detection signal DS may include valid signals output when an error does not exist in alignment and bonding between the first chip 1CH and the second chip 2CH, which are shown in FIG. 1, and error signals output when an error does exist in the alignment and bonding between the first chip 1CH and the second chip 2CH, which are shown in FIG. 1. For example, when the sub-test pads TP include the first to fourth sub-test pads 1TP to 4TP, in the detection signal DS, first to fourth signals may be output as the valid signals, and first to third error signals Error 1 to Error 3 may be output as the error signals.

Sub-test code signals input to the detection circuit DC may vary according to a number of sub-test pads. Hereinafter, the detection signal DS will be described by giving, as an example, a case where the first to fourth sub-test code signals 1CD to 4CD are input to the detection circuit DC. As will be described later in FIG. 4A and the like, the detection signal DS is output based on a structure in which the first to third sub-test pads 1TP and 3TP are adjacent to the input pad IP, the second sub-test pad 2TP is adjacent to the first sub-test pad 1TP, and the fourth sub-test pad 4TP is adjacent to the third sub-test pad 3TP.

The first signal is output when the first sub-test code signal 1CD has the second logic level H, and the second to fourth sub-test code signals 2CD to 4CD have the first logic level L. The second signal is output when the first and second sub-test code signals 1CD and 2CD have the second logic level H, and the third and fourth sub-test code signals 3CD and 4CD have the first logic level L. The third signal is output when the third sub-test code signal 3CD has the second logic level H, and the first, second, and fourth sub-test code signals 1CD, 2CD, and 4CD have the first logic level L. The fourth signal is output when the third and fourth sub-test code signals 3CD and 4CD have the second logic level H, and the first and second sub-test code signals 1CD and 2CD have the first logic level L.

The first signal means that the first sub-test pad 1TP and the input pad IP have been electrically connected to each other, the second signal means that the first and second sub-test pads 1TP and 2TP and the input pad IP have been electrically connected to each other, the third signal means that the third sub-test pad 3TP and the input pad IP have been electrically connected to each other, and the fourth signal means that the third and fourth sub-test pads 3TP and 4TP and the input pad IP have been electrically connected to each other.

The first error signal Error 1 is output when the first to fourth sub-test code signals 1CD to 4CD have the first logic level L. The second error signal Error 2 is output when the first and fourth sub-test code signals 1CD and 4CD have the second logic level H, regardless of logic levels of the second and third sub-test code signals 2CD and 3CD. The third error signal Error 3 is output when the second and third sub-test code signals 2CD and 3CD have the second logic level H, regardless of logic levels of the first and fourth sub-test code signals 1CD and 4CD.

A sub-test pad TP electrically connected to the input pad IP among the first to fourth sub-test pads 1TP to 4TP may be detected through the detection signal DS. When the detection signal DS is output as the first to fourth signals which are valid, it may be determined that bonding overlay between the first chip 1CH and the second chip 2CH, which are shown in FIG. 1, is normal. In addition, a sub-test pad TP electrically connected to the input pad IP may be detected according to the first to fourth signals. Alternatively, when the detection signal DS is output as an error signal Error, it may be determined that the bonding overlay is a failure.

Figure 4A:
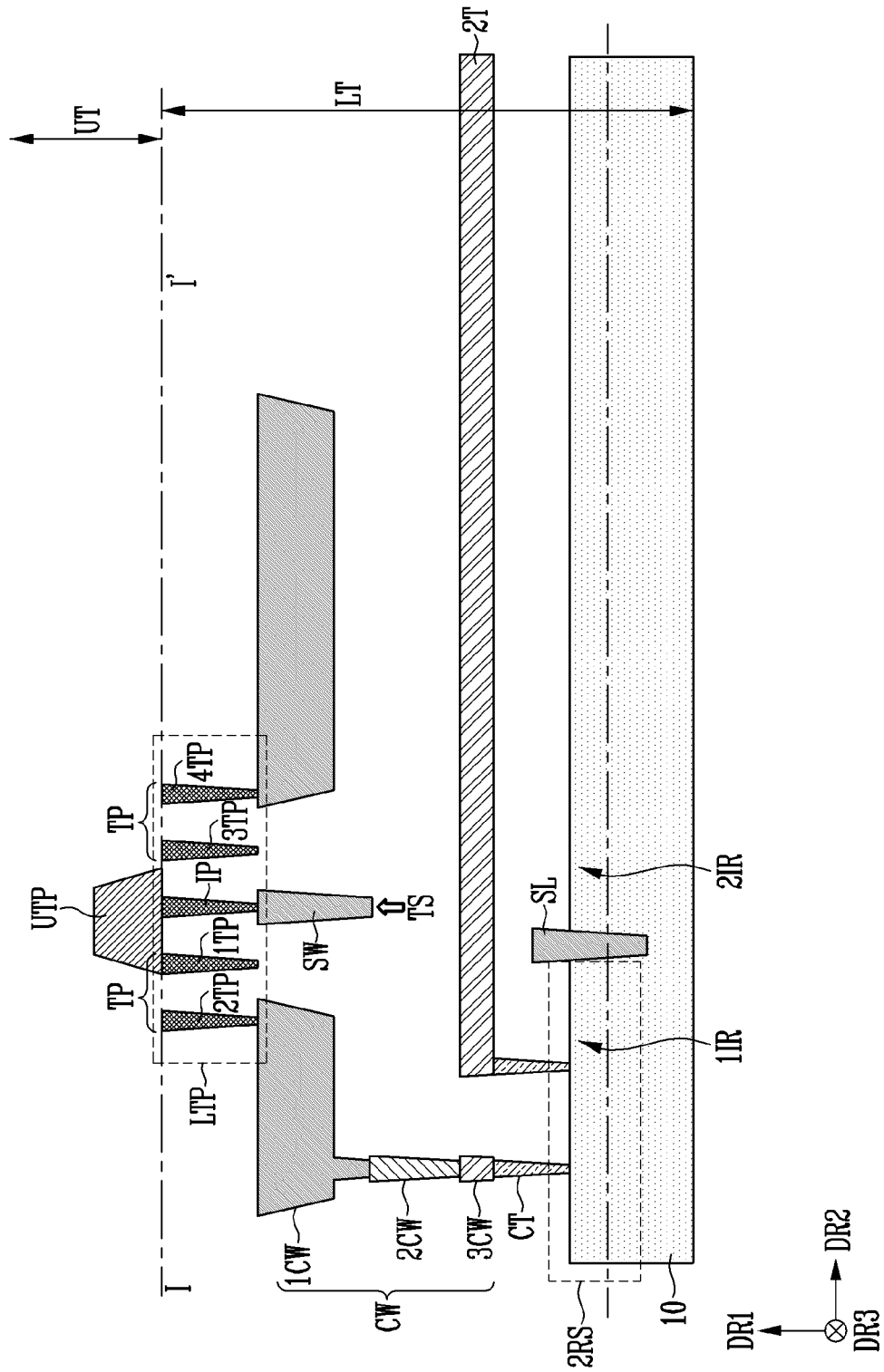

FIGS. 4A and 4B are sectional views illustrating a structure of a memory device in accordance with an embodiment of the present disclosure. FIGS. 4A and 4B illustrate an upper test area of the first chip 1CH shown in FIG. 1 and a lower test area of the second chip 2CH shown in FIG. 1.

As described with reference to FIG. 1, the first chip 1CH may include an upper test area UT. The second chip 2CH shown in FIG. 1 may include a semiconductor substrate 10 as shown in FIGS. 4A and 4B, and the semiconductor substrate 10 may include a peripheral circuit area PE and a lower test area LT as shown in FIG. 1.

The first chip 1CH shown in FIG. 1 may be provided to include an upper test pad UTP, and the second chip 2CH shown in FIG. 1 may be provided to include a lower test pad, a plurality of sub-test circuits (TC shown in FIG. 2), and a detection circuit DC as shown in FIGS. 4A and 4B. The first chip (1CH shown in FIG. 1) and the second chip (2CH shown in FIG. 1) may be provided through individual processes. Subsequently, as shown in FIGS. 4A and 4B, the first chip 1CH and the second chip 2CH, which are shown in FIG. 1, may be bonded to each other such that the upper test area UT can be aligned with the lower test area LT in a first direction DR1. A bonding boundary I-I' may be defined through bonding of the first chip (1CH shown in FIG. 1) and the second chip (2CH shown in FIG. 1).

Referring to FIGS. 4A and 4B, the upper test pad UTP may be disposed to overlap with a portion of the lower test area LT. The lower test pad LTP may be disposed on the lower test area LT of the semiconductor substrate 10. The lower test pad LTP may include a plurality of sub-test pads TP and an input pad IP. The plurality of sub-test pads TP and the input pad IP may be disposed on the lower test area LT to be spaced apart from each other in a second direction DR2 intersecting the first direction DR1. The plurality of sub-test pads TP and the input pad IP may be disposed to be spaced apart from each other at a constant distance in the second direction DR2. According to an alignment of the first chip 1CH and the second chip 2CH, which are shown in FIG. 1, some sub-test pads among the plurality of sub-test pads TP may be electrically connected to the input pad IP via the upper test pad UTP. According to an alignment of the first chip 1CH and the second chip 2CH, which are shown in FIG. 1, the sub-test pads TP and the input pad IP may be disposed at a distance narrower than a width of the upper test pad UTP such that sub-test pads connected to the upper test pad UTP can be changed. A maximum width of the upper test pad UTP in the second direction DR2 may be two times of an arrangement pitch of the plurality of sub-test pads TP and the input pad IP.

The sub-test pads TP may be symmetrically arranged with respect to the input pad IP. Thus, it is determined which sub-test pad TP the upper test pad UTP has been electrically connected to with respect to the input pad IP, so that it can be determined which side the upper test pad UTP has been arranged biased toward as compared with the first chip 1CH and the second chip 2CH.

A number of the sub-test pads TP is not limited to the number shown in the drawings. For example, first and second sub-test pads 1TP and 2TP may be spaced apart from each other with respect to the input pad IP. In addition, first to sixth sub-test pads may be spaced apart from each other with respect to the input pad IP. Because it is determined whether the first chip (1CH shown in FIG. 1) and the second chip (2CH shown in FIG. 1) have been appropriately arranged through the sub-test pads TP symmetrically formed with respect to the input pad IP, it is appropriate that the number of the sub-test pads TP should be formed as an even number. However, the number of the sub-test pads TP is not to be necessarily formed as the even number.

The sub-test pads TP may be connected to the semiconductor substrate 10 through connection wires CW and contacts CT. A structure in which the sub-test pads TP are connected to the semiconductor substrate 10 is similar for each sub-test pad. Hereinafter, the structure in which the sub-test pad TP is connected to the semiconductor substrate 10 will be described by giving the second sub-test pad 2TP as an example.

The second sub-test pad 2TP may be electrically connected to a first connection wire 1CW, and the first connection wire 1CW may extend in the second direction DR2. The first connection wire 1CW may be electrically connected to a second connection wire 2CW, and the second connection wire 2CW may extend in a third direction DR3 intersecting the first and second directions DR1 and DR2. The second connection wire 2CW may be electrically connected to a third connection wire 3CW, and the third connection wire 3CW may extend in the second direction DR2. The third connection wire 3CW may be connected to the semiconductor substrate 10 through a contact CT.

Referring to FIG. 4A, the second sub-test pad 2TP may be electrically connected to the semiconductor substrate 10. Specifically, when a test signal TS is input through a signal input wire SW connected to the input pad IP, the test signal TS is transferred to the upper test pad UTP. When the upper test pad UTP is formed to be connected to the second sub-test pad 2TP, the test signal TS is transferred to the second sub-test pad 2TP from the upper test pad UTP. The transferred test signal TS may be transferred to the semiconductor substrate 10 through the first to third connection wires 1CW to 3CW and the contact CT.

The semiconductor substrate 10 may include a plurality of active regions separated by a separation layer SL, and a plurality of impurity regions including at least one of an n-type impurity or a p-type impurity may be formed inside each active region. The plurality of impurity regions may constitute the plurality of resistors of the plurality of test circuits shown in FIG. 2.

For example, the semiconductor substrate 10 may include a first impurity region 1IR and a second impurity region 2IR, and the separation layer SL may be formed between the first impurity region 1IR and the second impurity region 2IR. The first impurity region 1IR may be defined as an impurity region connected to the second sub-test pad 2TP, and the second impurity region 2IR may be defined as an impurity region connected to another sub-test pad (e.g., 1TP).

The second sub-test pad 2TP may be electrically connected to the first impurity region 1IR through the first to third connection wires 1CW to 3CW and the contact CT. The first impurity region 1IR connected to the second sub-test pad 2TP may defined as a second resistor 2RS.

Referring to FIG. 4B, a plurality of insulating layers and a plurality of conductive patterns may be formed on the semiconductor substrate 10. The plurality of conductive patterns may be respectively disposed on the plurality of insulating layers. The plurality of conductive patterns may constitute the plurality of resistors of the plurality of test circuits shown in FIG. 2.

For example, a conductive pattern 12 and an insulating layer 11 may be formed between the semiconductor substrate 10 and the contact CT. The insulating layer 11 and the conductive pattern 12 may be formed in a process of forming a transistor of the peripheral circuit provided in the peripheral circuit area PE shown in FIG. 1. In an embodiment, the conductive pattern 12 may be formed of poly-silicon constituting a gate of the transistor. The insulating layer 11 may be formed of an insulating material constituting a gate insulating layer of the transistor. For example, the insulating layer 11 may be formed of oxide.

The second sub-test pad 2TP and the conductive pattern 12 may be electrically connected to each other. Specifically, when a test signal TS is input through the signal input wire SW connected to the input pad IP, the test signal TS is transferred to the upper test pad UTP. When the upper test pad UTP is formed to be connected to the second sub-test pad 2TP, the test signal TS is transferred to the second sub-test pad 2TP from the upper test pad UTP. The transferred test signal TS may be transferred to the conductive pattern 12 through the first to third connection wires 1CW to 3CW and the contact CT.

The conductive pattern 12 may be defined as a second resistor 2RS connected to the second sub-test pad 2TP.

Referring to FIGS. 4A and 4B, the second resistor 2RS may be connected to a second terminal 2T through the contact CT. The second terminal 2T may be connected to the detection circuit (DC shown in FIG. 2). Therefore, a signal input to the input pad IP may be input to the second sub-test pad 2TP through the upper test pad UTP. The signal input to the second sub-test pad 2TP may be input to the second terminal 2T via the second resistor 2RS, and be input to the detection circuit (DC shown in FIG. 2) through the second terminal 2T. The detection circuit (DC shown in FIG. 2) may output the detection signal (DS shown in FIG. 2), and determine whether an electrical connection between the second sub-test pad 2TP and the upper test pad UTP has been made through the detection signal.

Referring to FIGS. 1, 2, 3, 4A, and 4B, the first chip 1CH including the upper test pad UTP and the second chip 2CH including the input pad IP, the plurality of sub-test pads TP, the plurality of sub-test circuits TC, and the detection circuit DC may be bonded to each other such that the upper test pad UTP and the input pad IP are connected to each other in the first direction DR1. Accordingly, when a test signal is input to the input pad IP, a plurality of sub-test code signals CD may be output from the plurality of sub-test circuits TC through the upper test pad UTP according to whether a connection between the plurality of sub-test pads TP and the upper test pad UTP has been made. The plurality of sub-test code signals CD may be output as one detection signal through a logical operation performed by the detection circuit DC.

A sub-test pad TP electrically connected to the input pad IP among the plurality of sub-test pads TP may be detected through the detection signal DS. The sub-test pad TP electrically connected to the input pad IP corresponds to a sub-test pad TP electrically connected to the upper test pad UTP.

Thus, when the first chip 1CH and the second chip 2CH are bonded to each other, the sub-test pad TP electrically connected to the upper test pad UTP is detected based on the detection signal DS, so that it can be determined whether an alignment error between the first chip 1CH and the second chip 2CH exits. That is, a sub-test pad overlapping with the upper test pad UTP among the plurality of sub-test pads TP can be detected based on the detection signal DS.

Figure 5A:
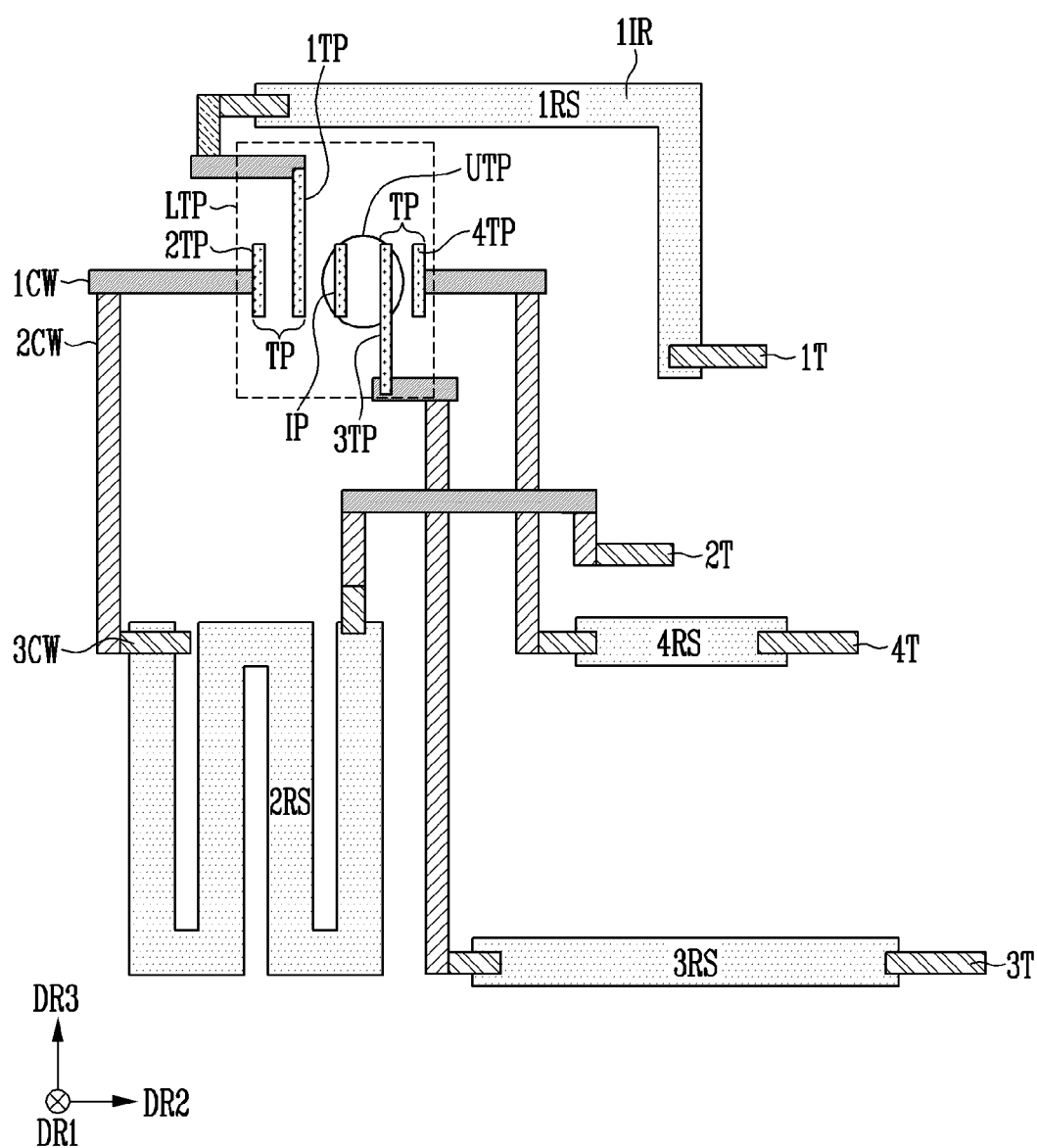
FIGS. 5A and 5B are views illustrating a layout of a plurality of sub-test circuits and an upper test pad of the memory device in accordance with an embodiment of the present disclosure.
Figure 5B:
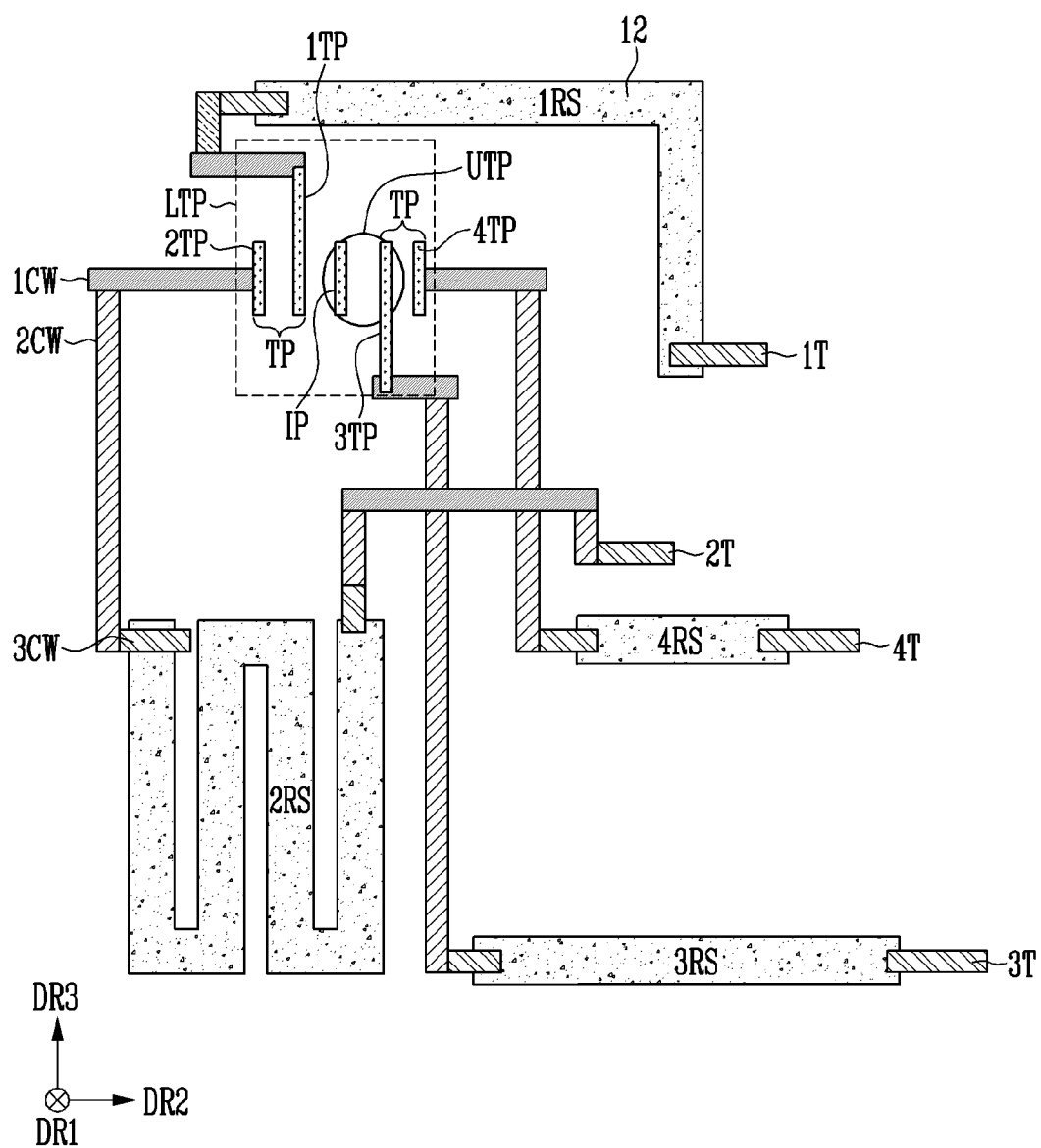

FIGS. 5A and 5B are views illustrating a layout of the plurality of sub-test circuits and the upper test pad of the memory device in accordance with an embodiment of the present disclosure.

Referring to FIGS. 5A and 5B, the upper test pad UTP may overlap with the input pad IP of the lower test pad LTP. The input pad IP included in the lower test pad LTP and the plurality of sub-test pads TP may be formed to be spaced apart from each other at the same distance in the second direction DR2. Also, the plurality of sub-test pads TP and the input pad IP may be formed with the substantially same width. The plurality of sub-test pads TP may include first to fourth sub-test pads 1TP to 4TP. The first to fourth sub-test pads 1TP to 4TP may be respectively connected to first to third connection wires 1CW to 3CW. The first to fourth sub-test pads 1TP to 4TP may be respectively connected to first to fourth resistors 1RS to 4RS through the first to third connection wires 1CW to 3CW. The first to fourth resistors 1RS to 4RS may be respectively connected to first to fourth terminals 1T to 4T. The first to fourth terminals 1T to 4T may be connected to the detection circuit (DC shown in FIG. 2). For example, the first sub-test pad 1TP may be connected to the first resistor 1RS through the first to third connection wires 1CW to 3CW, but connected to the first terminal 1T through the first resistor 1RS, and be connected to the detection circuit through the first terminal 1T.

First to third connection wires 1CW to 3CW connected to any one of the first to fourth sub-test pads 1TP to 4TP may be insulated from first to third connection wires 1WC to 3WC connected to another sub-test pad. To this end, the layout of the first to third connection wires 1WC to 3WC may be variously designed.

The first to fourth resistors 1RS to 4RS may be spaced apart from each other. The first to fourth resistors 1RS to 4RS may be formed in different shapes to have different resistance values. Each of the first to fourth resistors 1RS to 4RS may include an impurity region in the semiconductor substrate as shown in FIG. 5A or include a conductive pattern on the semiconductor substrate as shown in FIG. 5B. The first to fourth terminals 1T to 4T may be spaced apart from each other.

Figure 6:
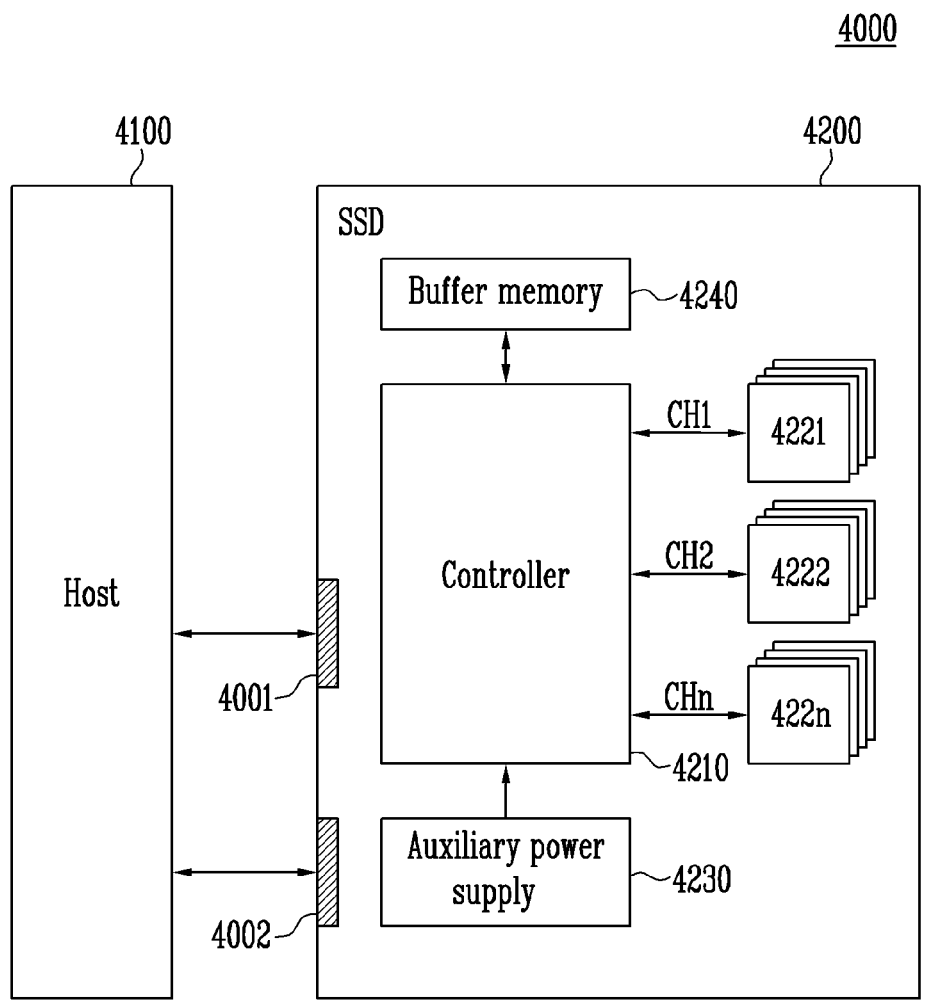
FIG. 6 is a diagram illustrating a Solid State Drive (SSD) system to which the memory device of the present disclosure is applied.

FIG. 6 is a diagram illustrating a Solid State Drive (SSD) system to which a memory device of the present disclosure is applied.

Referring to FIG. 6, a SSD system 4000 includes a host 4100 and an SSD 4200. The SSD 4200 may exchange a signal with the host 4100 through a signal connector 4001 and be supplied with power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be transmitted based on an interface between the host 4100 and the SSD 4200. The signal may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. For example, the auxiliary power supply 4230 may be located in the SSD 4200 or be located the outside of the SSD 4200. The auxiliary power supply 4230 may be located on a main board and provide auxiliary power to the SSD 4200.

The buffer memory 4240 may be used as a buffer memory of the SSD 4200. For example, the buffer memory 4240 may temporarily store data received from the host 4100 or data received from the plurality of memory devices 4221 to 422n, or temporarily store metadata (e.g., a mapping table) of the plurality of memory devices 4221 to 422n. The buffer memory 4240 may include volatile memory such as DRAM, SDRAM, DDR SDRAM, LPDDR SDRAM, and GRAM or nonvolatile memory such as FRAM, ReRAM, STT-MRAM, and PRAM.

In accordance with the present disclosure, a bonding overlay failure of the memory device can be checked.

While the present disclosure has been shown and described with reference to some embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or some of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been described in the drawings and specification. Although specific terminologies are used here, those are only to explain embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
    a first chip including a memory cell array; and
    a second chip overlapping with the first chip by bonding to the first chip, wherein the second chip includes:
    a semiconductor substrate including a peripheral circuit area and a lower test area;
    a plurality of sub-test pads and an input pad, disposed on the lower test area of the semiconductor substrate and spaced apart from each other;
    a plurality of sub-test circuits respectively connected to the plurality of sub-test pads; and
    a detection circuit connected to a plurality of terminals of the plurality of sub-test circuits, the detection circuit being configured to output a detection signal changed according to a plurality of signals input from the plurality of terminals,
    wherein the first chip includes an upper test pad overlapping with a portion of the lower test area of the semiconductor substrate,
    wherein the upper test pad is bonded and connected to the input pad and any one of the plurality of sub-test pads, and
    wherein the detection circuit outputs the detection signal according to the plurality of signals changed according to which sub-test pad, among the plurality of sub-test pads, the upper test pad is bonded and connected to.

2. The memory device of claim 1, wherein the plurality of sub-test pads and the input pad are spaced apart from each other at a constant distance.

3. The memory device of claim 1, wherein the plurality of sub-test pads and the input pad are separated by a distance narrower than a width of the upper test pad.

4. The memory device of claim 1, wherein the plurality of sub-test pads are substantially symmetrically arranged with respect to the input pad.

5. The memory device of claim 1, wherein the plurality of sub-test circuits includes a plurality of resistors having different resistance values.

6. The memory device of claim 5, wherein the second chip further includes a gate insulating layer on the semiconductor substrate, and the plurality of resistors includes a plurality of conductive patterns disposed on the lower test area of the semiconductor substrate with the gate insulating layer interposed therebetween.

7. The memory device of claim 5, wherein the second chip includes a plurality of separation layers formed in the semiconductor substrate, and wherein the lower test area of the semiconductor substrate includes a plurality of impurity regions separated from each other by the plurality of separation layers to respectively form the plurality of resistors.

8. A method of testing a memory device for a failure, the method comprising:
    providing a first chip including an upper test pad;
    providing a second chip including an input pad, a plurality of sub-test pads arranged at both sides of the input pad to be spaced apart from each other, a plurality of sub-test circuits connected to the sub-test pads, and a detection circuit connected to the plurality of sub-test circuits;
    bonding the first chip and the second chip to each other such that the upper test pad and the input pad are connected to each other in a first direction and the upper test pad is connected to any one of the plurality of sub-test pads;
    outputting a plurality of signals input to the detection circuit from the plurality of sub-test circuits by inputting a test signal to the input pad; and
    determining an alignment error between the first chip and the second chip by checking the one sub-test pad connected to the upper test pad based on a detection signal output from the detection circuit according to the plurality of signals.

9. The method of claim 8, wherein the plurality of signals includes a first logic level and a second logic level.

10. The method of claim 9, wherein the first logic level is output from a sub-test circuit which is not electrically connected to the input pad among the plurality of sub-test circuits, and
    the second logic level is output from a sub-test circuit electrically connected to the input pad among the plurality of sub-test circuits, and
    wherein whether an electrical connection between each of the plurality of sub-test circuits and the input pad has been made corresponds to whether a connection between each of the plurality of sub-test pads and the upper test pad has been made.

11. The method of claim 8, wherein the plurality of sub-test circuits includes a plurality of resistors having different resistance values.

12. The method of claim 9, wherein the plurality of sub-test pads includes a first sub-test pad, a second sub-test pad, a third sub-test pad, and a fourth sub-test pad, and
    wherein the first and third sub-test pads are adjacent to the input pad,
    the second sub-test pad is adjacent to the first sub-test pad, and
    the fourth sub-test pad is adjacent to the third sub-test pad.

13. The method of claim 12, wherein the plurality of signals corresponding to at least one of the first logic level and the second logic level are output from the plurality of sub-test circuits, and
    wherein the plurality of sub-test circuits includes first to fourth sub-test circuits respectively connected to the first to fourth sub-test pads.

14. The method of claim 13, wherein, when the second logic level is input as the test signal to the input pad and the first logic level is output from each of the first to fourth sub-test circuits,
    an error signal is output as the detection signal.

15. The method of claim 13, wherein, when the second logic level is input as the test signal to the input pad and is output from each of the first and fourth sub-test circuits,
    an error signal is output as the detection signal.

16. The method of claim 13, wherein, when the second logic level is input as the test signal to the input pad and is output from each of the second and third sub-test circuits, an error signal is output as the detection signal.

17. The method of claim 8, wherein each of the plurality of sub-test pads have substantially the same width.

* * * * *